(12) United States Patent
Ronchini Ximenes et al.

(10) Patent No.: US 10,637,485 B2
(45) Date of Patent: Apr. 28, 2020

(54) OSCILLATOR ARRANGEMENT FOR TIME-TO-DIGITAL CONVERTER FOR LARGE ARRAY OF TIME-OF-FLIGHT IMAGE SENSOR DEVICES

(71) Applicant: ECOLE POLYTECHNIQUE FEDERALE DE LAUSANNE (EPFL), Lausanne (CH)

(72) Inventors: Augusto Ronchini Ximenes, Delft (NL); Preethi Padmanabhan, Neuchatel (CH); Edoardo Charbon, The Hague (NL)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 211 days.

(21) Appl. No.: 15/941,411

(22) Filed: Mar. 30, 2018

(65) Prior Publication Data

US 2019/0305784 A1    Oct. 3, 2019

(51) Int. Cl.
| | |
|---|---|
| *G01S 7/486* | (2020.01) |
| *H03L 7/099* | (2006.01) |
| *G04F 10/00* | (2006.01) |
| *G01S 7/4865* | (2020.01) |
| *G01S 17/89* | (2020.01) |
| *H03H 7/38* | (2006.01) |

(52) U.S. Cl.
CPC .......... *H03L 7/0995* (2013.01); *G01S 7/4865* (2013.01); *G01S 17/89* (2013.01); *G04F 10/005* (2013.01); *H03H 7/38* (2013.01)

(58) Field of Classification Search
CPC ....... G01S 7/4865; G04F 10/005; H03H 7/38; H03L 7/0995
USPC ........................................... 250/214 R, 208.1
See application file for complete search history.

(56) References Cited

U.S. PATENT DOCUMENTS 9,170,564 B2 * 10/2015 Sato ...................... G04F 10/005

OTHER PUBLICATIONS

Ximenes, Augusto Ronchini et al., Mutually Coupled Ring Oscillators for Large Array Time-of-Flight Imagers, R25, 2017, Ecole Polytechnique Fédérale de Lausanne, Switzerland.

* cited by examiner

*Primary Examiner* — Que Tan Le
(74) *Attorney, Agent, or Firm* — Levenfeld Pearlstein, LLC

(57) ABSTRACT

An oscillator arrangement for time-to-digital converters for a 3D image sensor device includes a plurality of oscillators arranged as an array each oscillator being associated to one time-to-digital converter, and at least one coupling unit respectively arranged between at least two of the oscillators, so that oscillation in the at least two oscillators at a fundamental frequency is synchronized between the at least two coupled oscillators.

10 Claims, 7 Drawing Sheets a)

b)

OSCILLATOR ARRANGEMENT FOR TIME-TO-DIGITAL CONVERTER FOR LARGE ARRAY OF TIME-OF-FLIGHT IMAGE SENSOR DEVICES

TECHNICAL FIELD

The present invention relates to integrated time-of-flight image sensor devices for 3D imaging applications.

TECHNICAL BACKGROUND

Time-resolved optical sensors have become important for various applications, such as PET, FLEM and LiDAR. These image sensor devices, when implemented in CMOS, generally comprise avalanche photodiodes operating in Geiger mode, known as single photon avalanche diodes (SPAD), and time-to-digital converters which determine the time of arrival of photons. The photodiodes are arranged in an array of a sensor pixel area. One or more photodiodes are each coupled with one time-to-digital converter, so that in time-correlated operation mode, the timing of incoming photons which are periodically generated by a laser can be precisely measured so that an accurate 3D image reconstruction of the scanned scene can be obtained.

Time-of-flight image sensors require high levels of accuracy and precision on time quantization typically using time-to-digital converters. Therefore, the availability of precise and uniform timing information over the sensor pixel area is required due to non-linearity and jitter.

In a most common case, a single time-to-digital converter is used together with a distribution network as e.g. shown in Carimatto, A., et al., "A 67,392-SPAD PVTB-Compensated Multi-Channel Digital SiPM with 432 Column-Parallel 48 ps 17 b TDCs for Endoscopic Time-of-Flight PET", ISSCC 2015. As such a single time-to-digital converter requires to be used together with a distribution network, high power consumption and non-linearity are imposed as multiple phases of an oscillator or the time-to-digital converter need to be routed over the sensor area.

A further approach provides one time-to-digital converter per pixel which can lead to a lower power consumption, in case of a photon-starved application. However, due to its event-driven operation those time-to-digital converters are required to operate in open loop and independently from each other, which is highly susceptible to process-voltage-temperature variations, jitter accumulations and non-linearity, as e.g. shown in Richardson, J., et al., "A 32×32 50 ps resolution 10-bit time to digital converter array in 130 nm CMOS for time correlated imaging", CICC 2009.

Due to area constraints, typical oscillators for time-to-digital converters are formed by ring oscillators, such as known from P. Kinget, "Integrated GHz voltage-controlled oscillators", Springer, 1999.

Multiple oscillator coupling is used in many fields and applications as generally known from Galton, I., et al., "Clock distribution using coupled oscillators", ISCAS 1996. Due to uncorrelated phase noise in different oscillators, the phase noise of a system with coupled oscillators can be significantly reduced.

It is an object of the present invention to provide an oscillator arrangement for time-to-digital converters of an image sensor device which provides high accuracy timing information over the sensor pixel area.

SUMMARY OF THE INVENTION

This object has been achieved by the oscillator arrangement for time-to-digital converters for a time-of-flight image sensor device according to claim 1 and the image sensor device according to the further independent claim.

Further embodiments are indicated in the depending subclaims.

According to a first aspect, an oscillator arrangement for time-to-digital converters for a 3D image sensor device is provided, comprising:
a plurality of oscillators arranged as an array each oscillator being associated to one time-to-digital converter;
at least one coupling unit respectively arranged between at least two of the oscillators, so that oscillation in the at least two oscillators at a fundamental frequency is synchronized between the at least two coupled oscillators.

In general, providing an accurate reference phase/frequency for time-to-digital converters over a large sensor pixel area is limited by physical constraints depending on silicon imperfections, manufacturability variations, temperature IR drop, circuit asymmetries and the like. While some of the static variabilities can be compensated for, dynamic variations are hard to calibrate. Moreover, for long-term measurements, the accumulated jitter may cause larger imprecision than the quantization noise itself. Thus, a coherent design of the time-to-digital converter considering the jitter and resolution is needed. A finer time-to-digital converter resolution, which can lead to higher power consumption and data, is only justifiable if its correspondent jitter matches the quantization noise.

The above oscillator arrangement provides an oscillator grid which is at least partly spread over the sensor pixel area to provide timing information to time-to-digital converters each used by a portion of the pixels of the sensor pixel area. The time-to-digital converters are each associated to one of the oscillators of the oscillator arrangement which are mutually coupled with at least one oscillator of a neighbored time-to-digital converter. Such an arrangement overcomes the need for a centralized frequency generation and distribution.

Above oscillator arrangement allows a mutual coupling at a fundamental frequency of the oscillators synchronizing the oscillators in phase and frequency and perform noise filtering of internal, uncorrelated noises sources. Further, the oscillators which have slightly different fundamental frequencies due to silicon imperfections and manufacturability variations and which have after start-up random phases, phase and frequency alignment will be reached very shortly after start-up. Furthermore, if due to a time-of-arrival sampling of one of the time-to-digital converters, a disturbance is induced into one of the oscillators, the oscillators of neighbored time-to-digital converters force the out-of-phase oscillator to realign without propagating the error indefinitely like in an open-loop scenario.

Above oscillator arrangement for time-to-digital converters achieve a robust synchronization of timing signals supplied by the ring oscillators while further greatly reducing the phase noise which is at about the same frequency uncorrelated in different oscillators. Furthermore, it provides a low process-voltage-temperature dependency and similar power consumption of the sum of the number of oscillators, without extra power being spent in the synchronization.

The coupling between two ring oscillators can be made by means of a coupling unit defining a coupling strength, wherein the coupling unit includes one or more coupling elements and particularly comprises one or more coupling resistances and/or one or more coupling capacitors and/or one or more inductances which have to be carefully selected as they influence largely the transient time.

Furthermore, each of the at least one coupling unit may be respectively arranged between two neighboring oscillators of the array.

Particularly, each two neighboring ring oscillators of the array may be coupled with one of the at least one coupling unit.

According to an embodiment, the plurality of oscillators may comprise a plurality of relaxation oscillators, LC-tank oscillators or micromechanical oscillators.

It may be provided that the oscillators are formed as ring oscillators each comprising a number of inverters coupled with output to input interconnects in a closed loop, wherein each of the at least one coupling unit connects one output to input interconnect of one ring oscillator to another output to input interconnect of another ring oscillator.

According to an embodiment one output to input interconnect of the ring oscillator may be coupled to a counter wherein the output to input interconnect of one ring oscillator and the output to input interconnects of another one of the ring oscillators which are coupled via the coupling unit, have the same distance of the output to input interconnects coupled to the counter in terms of inverters.

Moreover, a PLL circuit may be provided which controls the oscillators depending on a reference frequency signal to adjust the frequency to a provided reference frequency. The PLL circuit may be an analog PLL circuit and configured to provide a common control voltage depending on one of the oscillators phases with respect to the reference frequency to control all oscillators. Alternatively, the PLL circuit may be a digital PLL (or digital word, in case of a digital PLL), shared among the oscillator, By implementing a single global PLL circuit slow temperature drifts can be tracked and compensated thereby and a stable well-defined frequency can be provided, thereby reducing calibration requirements.

According to a further aspect a 3D image sensor device is provided comprising:
  a photodiode array providing a plurality of pixels;
  the above oscillator arrangement,
  time-to-digital converters each associated to one of the ring oscillators of the oscillator arrangement so that the respective ring oscillator provides a timing information to the respective time to digital converter.

BRIEF DESCRIPTION OF THE DRAWINGS

Embodiments are described in more detail in conjunction with the accompanying drawings, in which.

DESCRIPTION OF EMBODIMENTS

Figure 1:
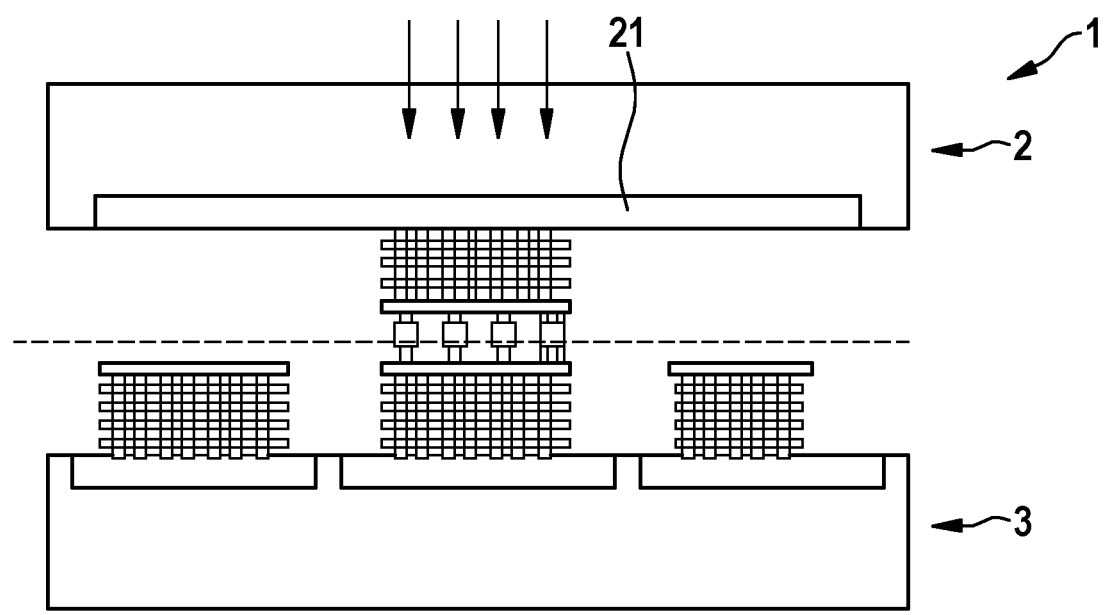
FIG. 1 schematically shows the configuration of a 3D imaging device in a cross-sectional view, based on stacking technology.

In the following, a basic structure of a 3D image sensor device of one embodiment is described in detail. Such an exemplary 3D image sensor device 1 is shown in FIG. 1 in a cross-sectional view. Substantially, the 3D image sensor device 1 has a stacked configuration with a sensing layer 2 including the pixel sensors in an array 21 formed with one avalanche photodiodes operating in Geiger mode, also known as single photon avalanche diodes SPAD, per pixel.

In a detection layer 3, a read-out circuitry 31 is coupled with the photodiode array 21. The read-out circuitry 31 is implemented including time-to-digital converters, each associated to one or more of the pixels included in the sensing layer 2. Particularly, the time-to-digital converters each are associated to the pixels (photodiodes) of a portion of the pixel area, substantially a rectangular area portion. To reduce signal propagation delays, the time-to-digital converters are directly arranged under the respective pixel area of the sensing layer 2 in a stacked arrangement of the image sensor device 1.

In the following the configuration of an example of a direct time-of-flight (DTOF) 3D single-photon avalanche diode (SPAD) based 3D imaging sensor device is described in detail.

Figure 2:
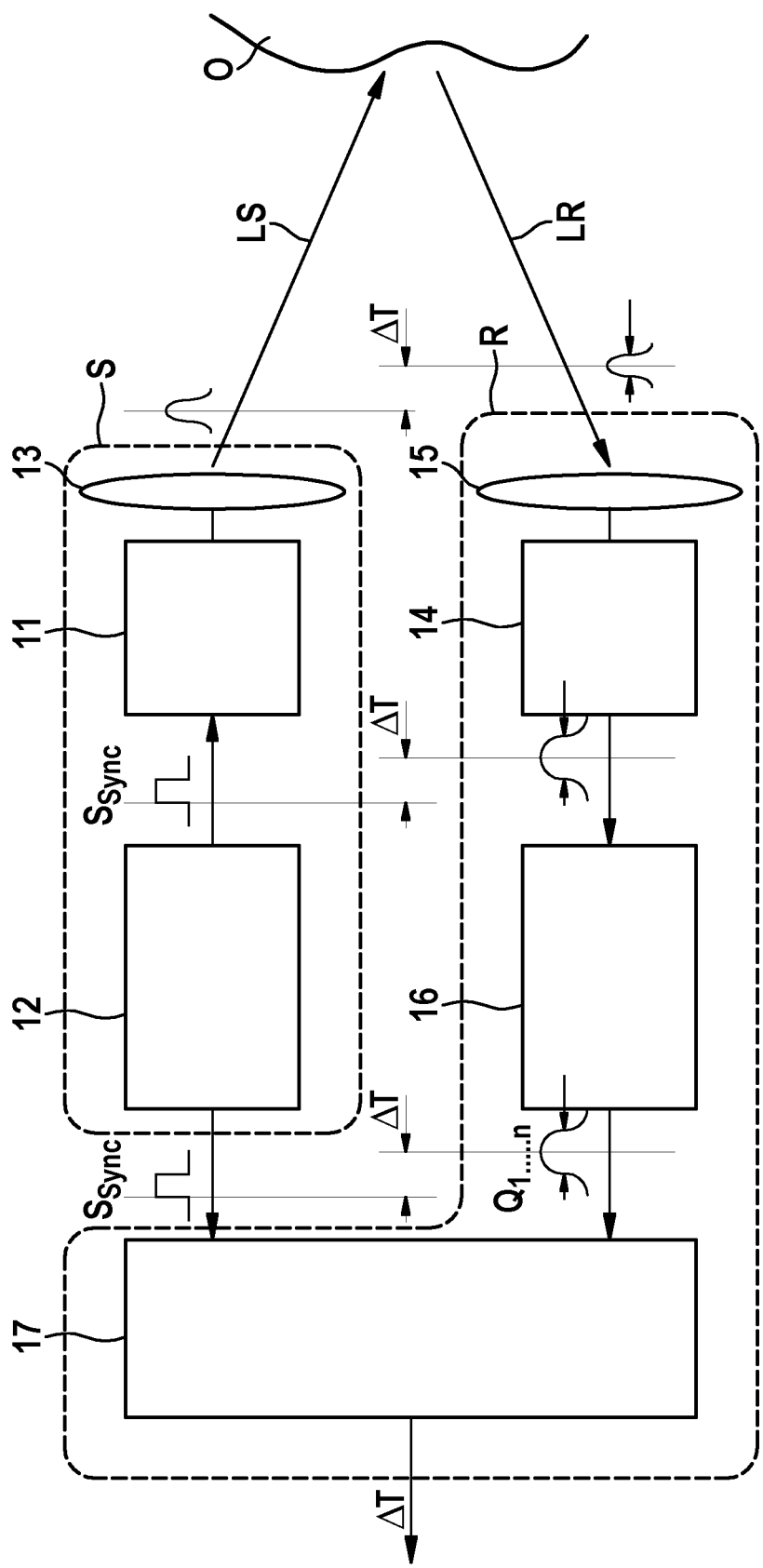
FIG. 2 shows a general configuration of an example of a photon detecting 3D imaging sensor device.

FIG. 2 depicts the basic concept of a DTOF imaging sensor device according to the present invention. On a sending side S, a diode laser 11 is controlled by a synchronization signal $S_{sync}$ provided by a pulse generator 12 so that a pulsed laser signal LS is directed onto an object O through one or more optical elements 13, such as a beam collimator or the like. The pulsed laser signal is reflected by the object O onto a receiver side R.

The receiver side R is formed by a photodiode array 14 onto which the reflected pulsed laser light LR is collected by a receiver optics 15 and detected by one or more of the photodiodes. The photodiodes may be formed by single-photon detecting diodes, such as SPADs. The signals from the photodiodes are received by means of a single quenching detector of a quenching detector array 16.

By the quenching detectors pulses of a respective detection signal $Q_{1 \ldots n}$ can be obtained based on the arrival time of a laser pulse of the reflected pulsed laser signal LR which has been received in the associated photodiode. So, depending on the number of photodiodes in the photodiode array 14 the number of detection signals $Q_{1 \ldots n}$ is obtained.

The travel time of the pulsed laser signal to the object O and back to the photodiode array 14 depends on the distance of the object O. Therefore, the travel time of the pulsed laser signal corresponds to the distance of the portion of the object to be measured wherein the laser signal pulse has been detected and so provides a distance information to the pixel which is associated to the respective portion of the object.

The travel time can be determined by a time-to-digital converter measuring a time difference between a pulse of the synchronization signal $S_{sync}$ and a corresponding pulse of the detection signals $Q_{1 \ldots n}$. Each of the differences is indicative for a scanned pixel received by the photodiode array 14. However, as a single pulse of the pulsed laser signal sent out by the diode laser 11 will likely trigger several photodiodes of the photodiode array 14 so that several detection signal pulses will be generated. A common approach to cope with these detection signal pulses is to apply a first-come-win-all strategy in a pulse selection unit, so that only the quickest detection signal pulse is considered. After one detection, the pulse selection unit is reset or self-resets, being available for a new detection.

Figure 3:
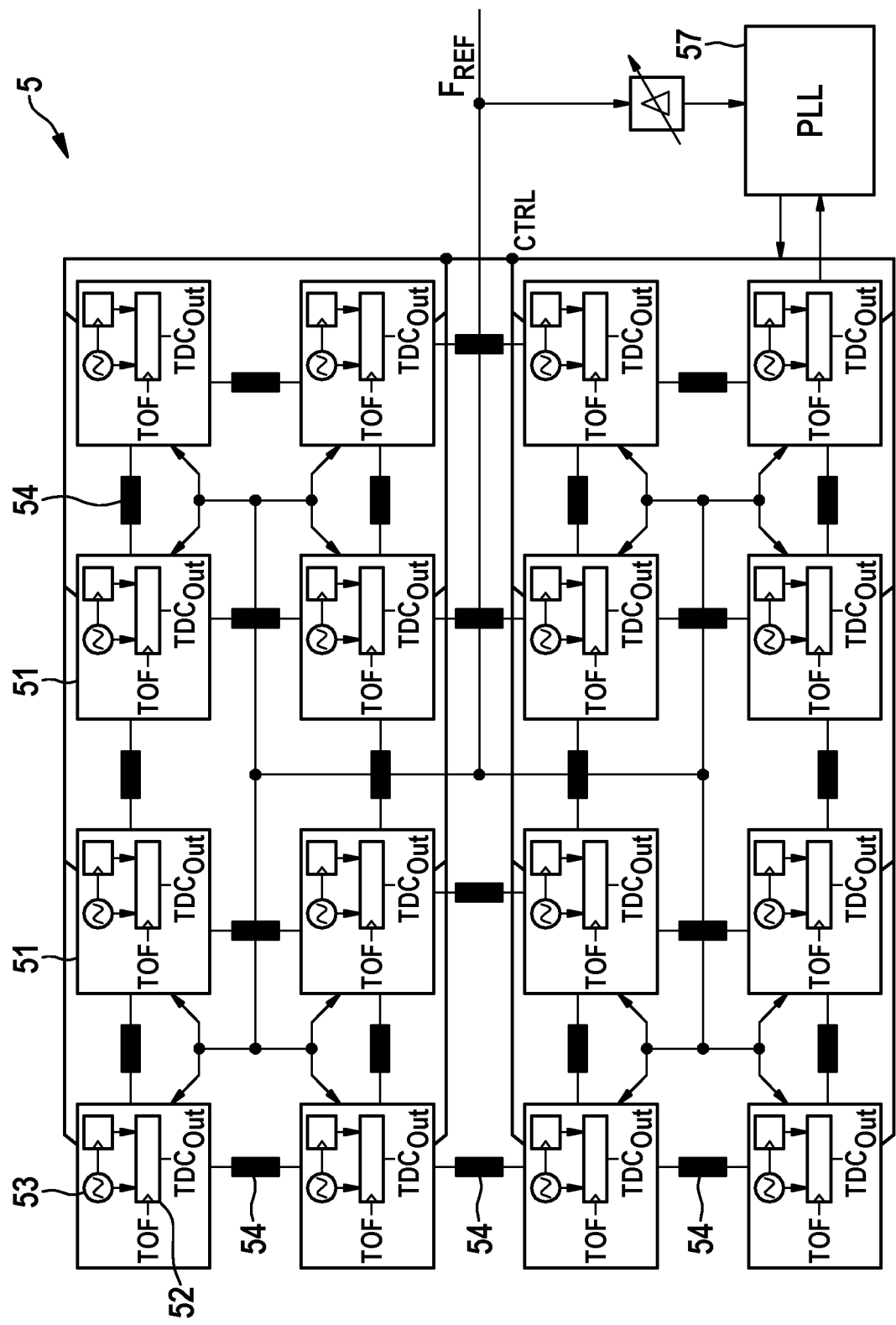
FIG. 3 shows a schematic view on a detection layer implementing time-to-digital converters, each having its own ring oscillator.

FIG. 3 shows an array arrangement 5 of the time-to-digital converters 51 spread along the sensor area array 21. Each time-to-digital converter 51 comprises an oscillator 52 and a measurement circuitry 53 which allows to measure a counter difference of a counter preferably continuously operated by the oscillator 52. The counter difference serves as a time difference measure. The evenly distributed time-to-digital converters 51 result in evenly distributed oscillators 52 in an oscillator array The oscillators 52 of the neighboring time-to-digital converters 51 are each mutually coupled with one or more oscillators 52 of neighboring time-to-digital converters 51 of the array arrangement 5. The coupling may be made between the oscillators 52 arranged closest to each other. The oscillators 52 can be formed as ring oscillators, relaxation oscillators, LC-tank oscillators or micromechanical oscillators. In the following it will be referred to ring oscillators for ease of description.

The coupling is performed by means of a coupling unit 54 which is formed as an impedance. This allows a mutual coupling at the fundamental frequency of the ring oscillators 51, synchronizing them in phase and frequency or to keep them synchronized in phase and frequency. So, the time-to-digital converters can be operated in a synchronized manner. Further oscillators which have a different fundamental frequency and random phases are urged to align each other in phase and frequency shortly after start-up or after the phase of one of the ring oscillators 52 is disturbed.

The selection of the coupling elements of the coupling unit 54 substantially influences the transient time. The coupling units 54 can be formed with one or more resistors and/or with one or more capacitors and/or with one or more inductors whose values are carefully selected to reduce transient time until phase locking (locking time). The chosen resistances and/or capacitances and/or inductances are selected depending on the strength of the oscillator themselves. If a system does not require super-fast locking time, weaker (higher resistances/lower capacitances) (more relaxed) coupling elements are desirable, thus reducing the stress in the neighbor oscillators upon a disturbance.

Figure 4:
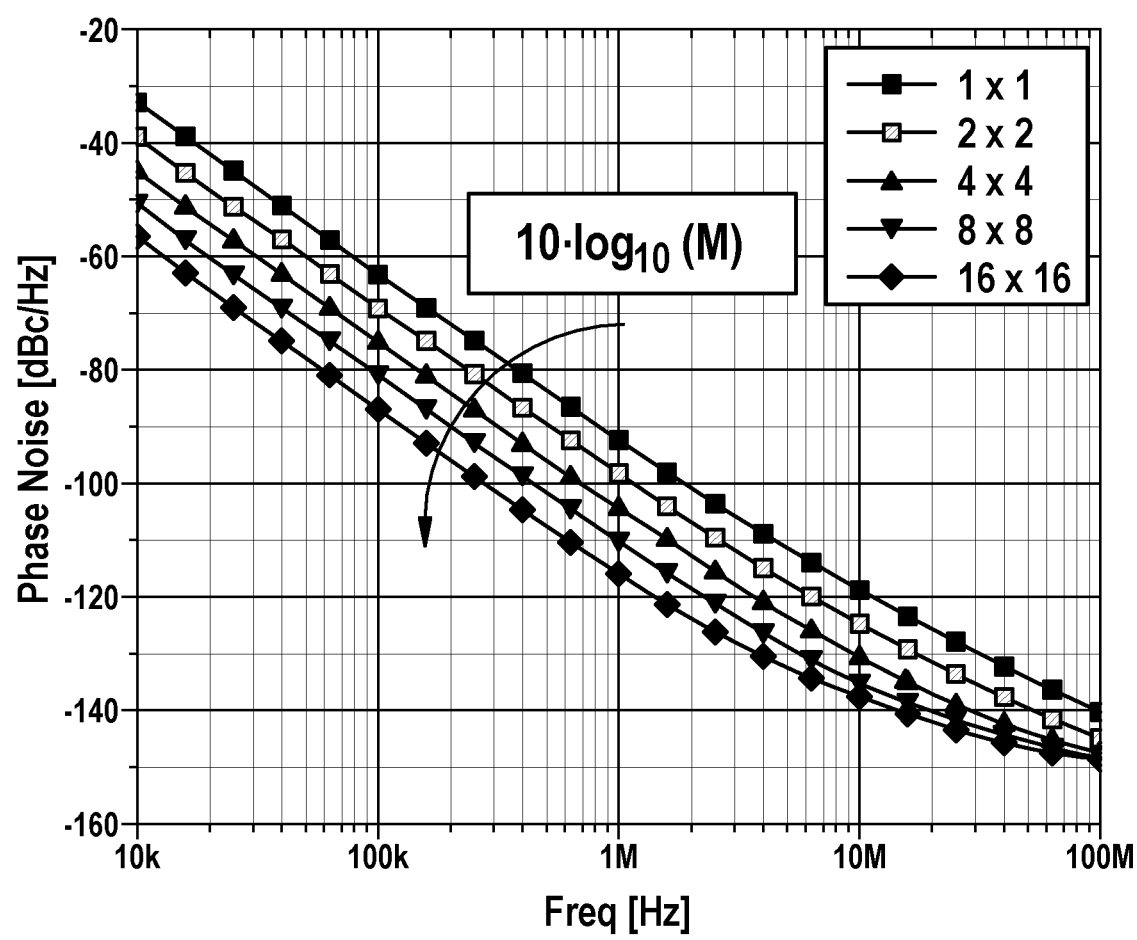
FIG. 4 shows a diagram indicating the reduction of phase noise in an array of time-to-digital converters of different sizes.

Furthermore, as the phase noise is uncorrelated between the ring oscillators 52 so that the coupling contributes to a reduction of the phase noise according to $10 \times \log_{10}$ (M), where M is the number of coupled oscillators. As can be seen in FIG. 4, depending on the number M of coupled oscillators 52 and depending on the frequency, the phase noise decreases substantially when the number of mutually coupled ring oscillators 52 increases.

Figure 5:
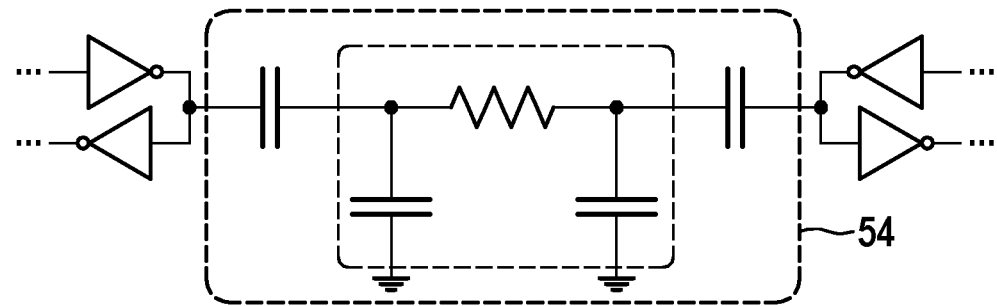
FIGS. 5a and 5b show schematic examples of a circuitry of a coupling unit.
Figure 5:
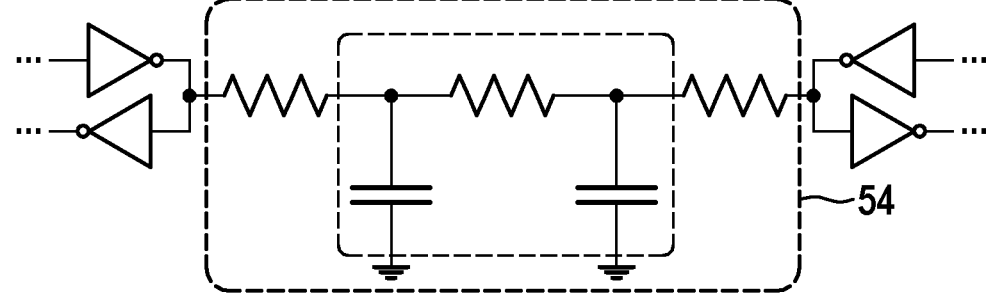

FIGS. 5a and 5b show exemplary embodiments of the coupling unit 54. The coupling unit of FIG. 5a shows a series connection of a first capacitor, a first resistor and a second capacitor while the nodes between the first capacitor and the first resistor and between the first resistor and the second capacitor are each connected to a reference (ground) potential by means of grounding capacitors. The coupling unit 54 of FIG. 5b differs from the embodiment of FIG. 5a in that the first and second capacitors are replaced by resistances. Such a coupling unit can also be applied to LC-tank oscillators.

Figure 6:
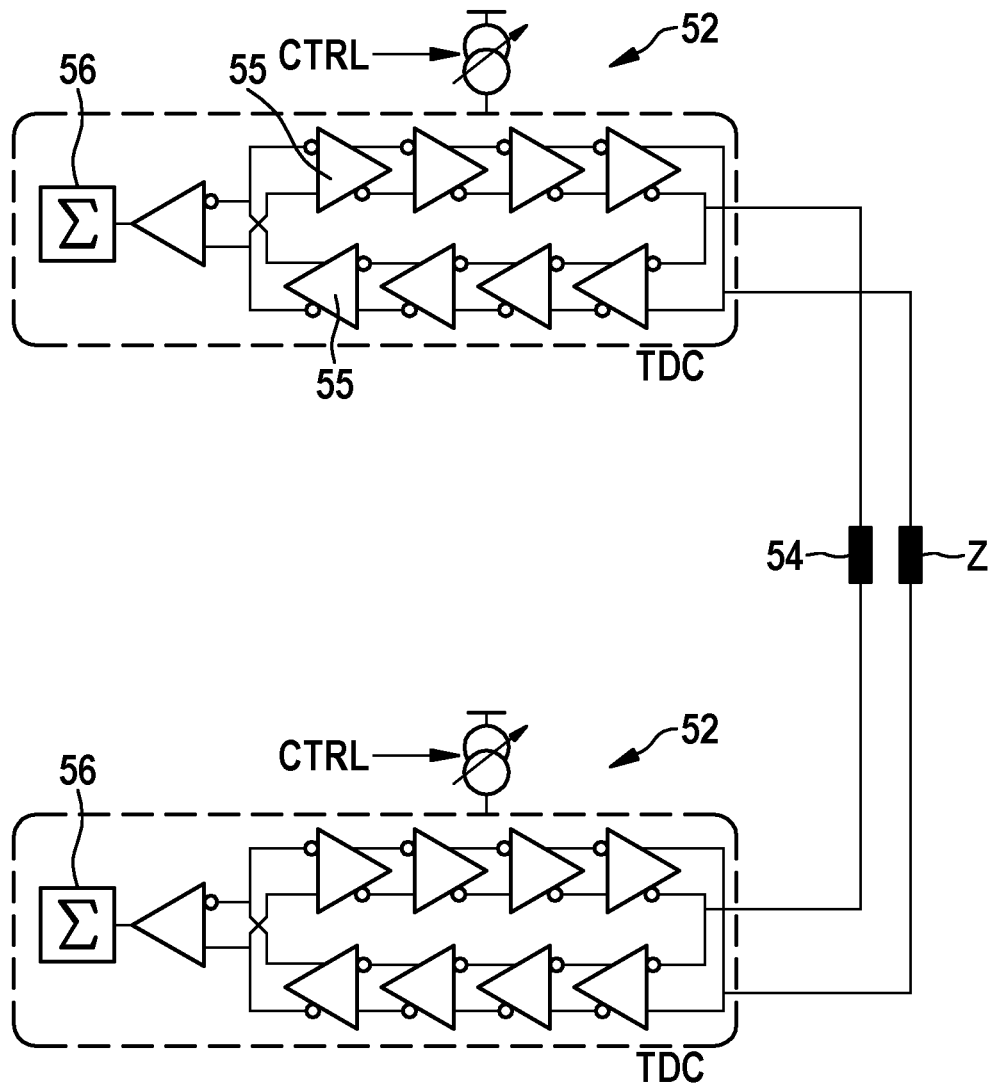
FIG. 6 shows a schematic view of two coupled ring oscillators.

FIG. 6 shows two coupled ring oscillators 52. Each ring oscillator 52 has a number of inverters 55 which are coupled by output to input interconnects preferably in a differential manner. In other embodiments the ring oscillator 52 may comprise non-differential inverters or inverters coupled in a pseudo-differential manner. In one ring oscillator 52, one output to input interconnect of an inverter 55 may be fed to a counter 56 which is incremented based on the fundamental frequency of the ring oscillator 52.

The coupling between two ring oscillators 52 is made by means of connecting the coupling unit 54 between one output of an inverter of one ring oscillator to an input of one of the inverters of another ring oscillator of a neighboring time to the digital converter.

Preferably, the coupling to a ring oscillator 52 of a neighboring tine-to-digital converter is not made at the output of the inverter which is also coupled to the counter 56. To achieve phase alignment, the ring oscillators 52 should have similar or identical structure and the coupling should be made to the input of the same inverters 55 in the structure, i.e. the coupling should be made between the output to input interconnects between the inverters 55 having the same distance from the counter 56 in terms of number of inverters 55.

Figure 7:
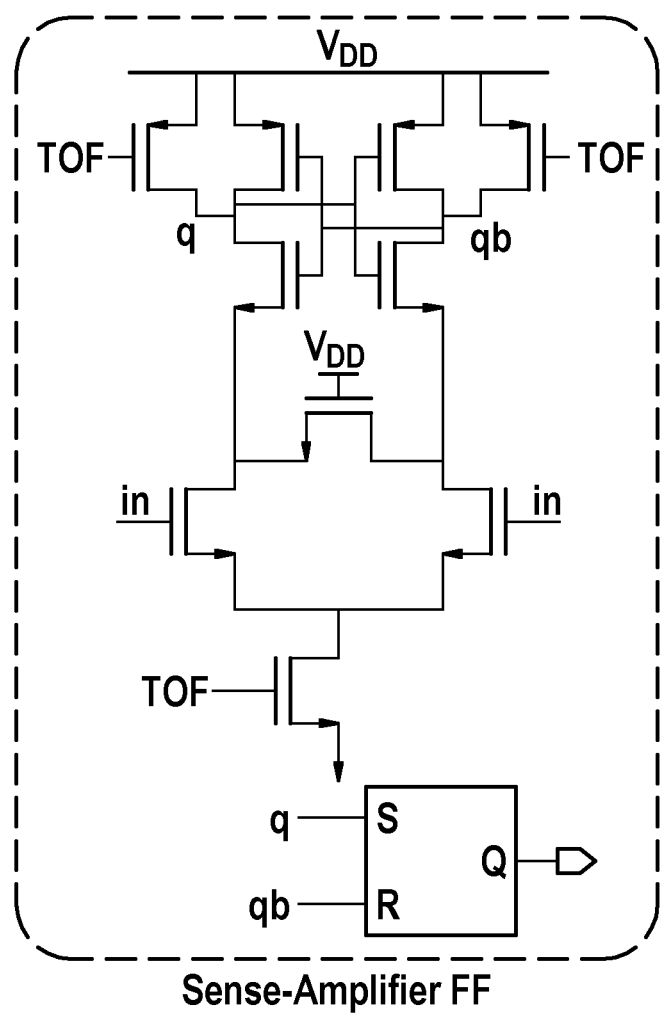
FIG. 7 shows a schematic of a sense amplifier flip-flop for sampling phases of the ring oscillator.

All output to input interconnects of the inverters 55 are coupled via sense amplifier flip-flops 60 to obtain a phase information further adding precision to the time measurement. In FIG. 7 an example of a sense amplifier flip-flop 60 is shown which allows to latch a status of the ring oscillator 52 by means of the logic levels of a respective output to input interconnect (signals in and ˆin) depending on a signal TOF applied when a detection event occurs.

As shown in FIG. 3, the ring oscillators 52 may have a control input CTRL to be controlled by means of a negative feedback loop PLL circuit 58 to adjust the frequency to a precise and desirable frequency. The loop bandwidth is set to be low, so long latencies in the process don't create instability issues. The type of PLL may be an analog or digital PLL, even an external PLL can be used, since the loop bandwidth is low.

The ring oscillators 52 are controlled by taking one of the oscillators phases and by providing a common voltage to control all oscillators. The PLL circuit 58 is configured to control the ring oscillators 52 by means of a control signal adapting their switching time based on a phase difference between a supplied reference frequency and an oscillation frequency of the oscillator arrangement. The mutually coupled oscillators will have the same frequency and locked phase by the end of the mutually injection process. However, the specific frequency and phase values are related to the overall performance of the array.

The invention claimed is:

1. An oscillator arrangement for time-to-digital converters for a 3D image sensor device, comprising:
   a plurality of oscillators arranged as an array each oscillator being associated to one time-to-digital converter;
   at least one coupling unit respectively arranged between at least two of the oscillators, so that oscillation in the at least two oscillators at a fundamental frequency is synchronized between the at least two coupled oscillators.

2. The oscillator arrangement according to claim 1, wherein the at least one coupling unit are respectively arranged between two neighboring oscillators of the array.

3. The oscillator arrangement according to claim 2, wherein each two neighboring oscillators of the array are coupled with at least one coupling unit.

4. The oscillator arrangement according to claim 1, wherein the at least one coupling unit includes an impedance.

5. The oscillator arrangement according to claim 4, wherein the coupling unit comprise one or more coupling resistors and/or one or more coupling capacitors and/or one or more coupling inductances.

6. The oscillator arrangement according to claim 1, wherein the plurality of oscillators comprise a plurality of relaxation oscillators, LC-tank oscillators or micromechanical oscillators.

7. The oscillator arrangement according to claim 1, wherein the oscillators are formed as ring oscillators each comprising a number of inverters coupled with output to input interconnects in a closed loop, wherein each coupling unit connects one output to input interconnect of one ring oscillator to another output to input interconnect of another ring oscillator.

8. The oscillator arrangement according to claim 7, wherein one output to input interconnect of the ring oscillator is coupled to a counter wherein the output to input interconnect of one ring oscillator and the output to input interconnects of another one of the ring oscillators which are coupled via the coupling unit, have the same distance of the output to input interconnects coupled to the counter in terms of inverters.

9. The oscillator arrangement according to claim 1, wherein a PLL circuit is provided which controls the oscillators depending on a reference frequency signal to adjust the frequency to a provided reference frequency, wherein particularly the PLL circuit is configured by providing a common control voltage depending on one of the oscillator phases with respect to the reference frequency to control all oscillators.

10. A 3D image sensor device comprising:
   a photodiode array providing a plurality of pixels;
   the oscillator arrangement according to claim 1, and
   time-to-digital converters each associated to one of the oscillators of the oscillator arrangement so that the respective oscillator provides a timing information to the respective time to digital converter.

* * * * *